United States Patent [19]

Balakrishnan

[11] Patent Number: 4,504,744
[45] Date of Patent: Mar. 12, 1985

[54] SCHOTTKY TTL INTEGRATED LOGIC GATE CIRCUIT WITH REDUCED SPEED POWER PRODUCT

[75] Inventor: Ramanatha V. Balakrishnan, San Jose, Calif.

[73] Assignee: National Semiconductor Corporation, Santa Clara, Calif.

[21] Appl. No.: 457,779

[22] Filed: Jan. 13, 1983

[51] Int. Cl.³ ................ H03K 19/013; H03K 19/088
[52] U.S. Cl. .................................. 307/456; 307/458; 307/299 A; 307/567
[58] Field of Search ............... 307/454, 456, 457, 458, 307/299 A, 317 A, 254, 270, 300, 567, 546

[56] References Cited

U.S. PATENT DOCUMENTS

| 3,510,685 | 5/1970 | Watanabe et al. | 307/456 |
| 3,751,680 | 8/1973 | Hodges | 307/458 |
| 4,321,490 | 3/1982 | Bechdolt | 307/456 |
| 4,415,817 | 11/1983 | Fletcher | 307/456 X |

FOREIGN PATENT DOCUMENTS

| 163918 | 12/1980 | Japan | 307/456 |
| 34229 | 4/1981 | Japan | 307/456 |

Primary Examiner—Stanley D. Miller
Assistant Examiner—David R. Bertelson
Attorney, Agent, or Firm—Gail W. Woodward; Paul J. Winters; Michael J. Pollock

[57] ABSTRACT

An inverter gate using advanced low power Schottky configuration is shown in which a feedback transistor is used to provide input pull up action. The transistor is a minimum area device that occupies less chip area than the elements that it replaces. It also conserves power so that the speed power product is reduced. The circuit further incorporates negative feedback associated with the input bias resistor whereby a smaller resistor can be employed without increasing supply current drain or input current.

16 Claims, 4 Drawing Figures

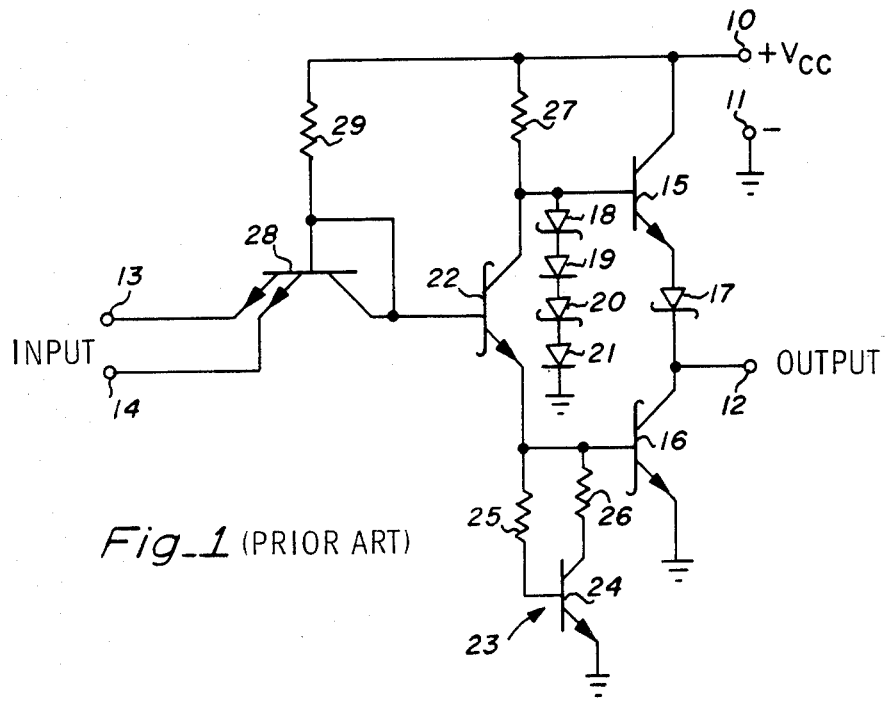
Fig_1 (PRIOR ART)
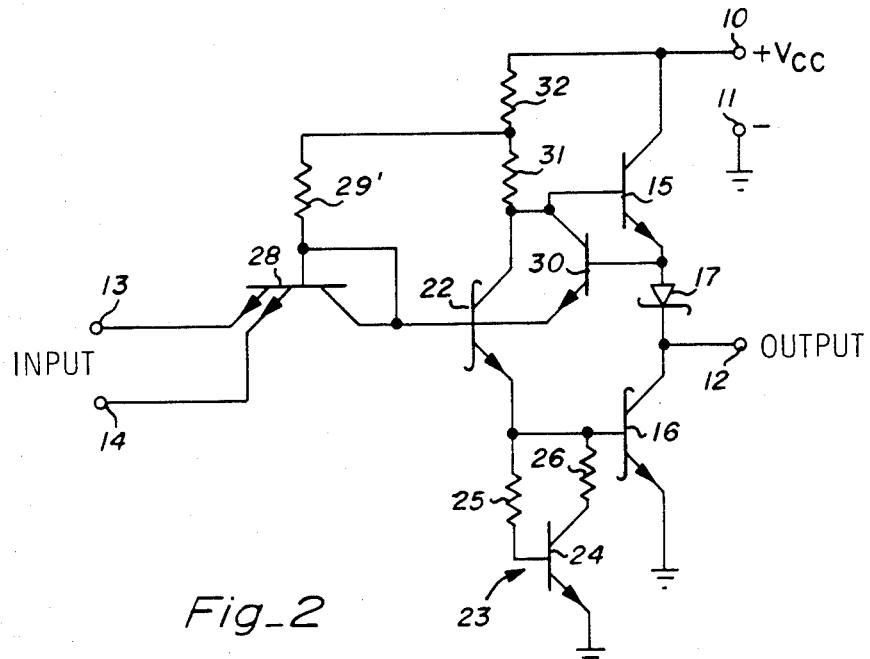
Fig_2

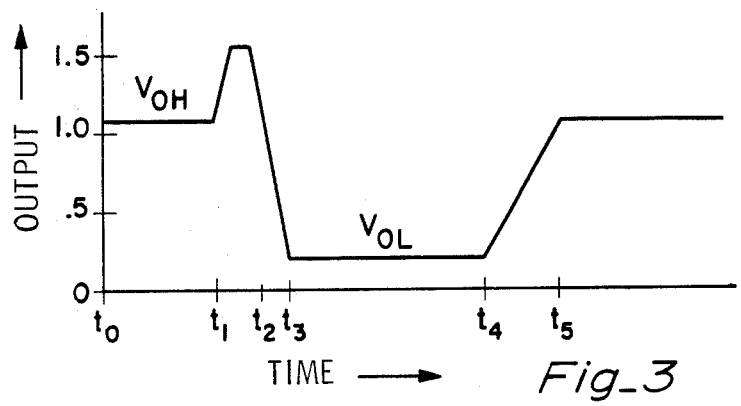
Fig_3
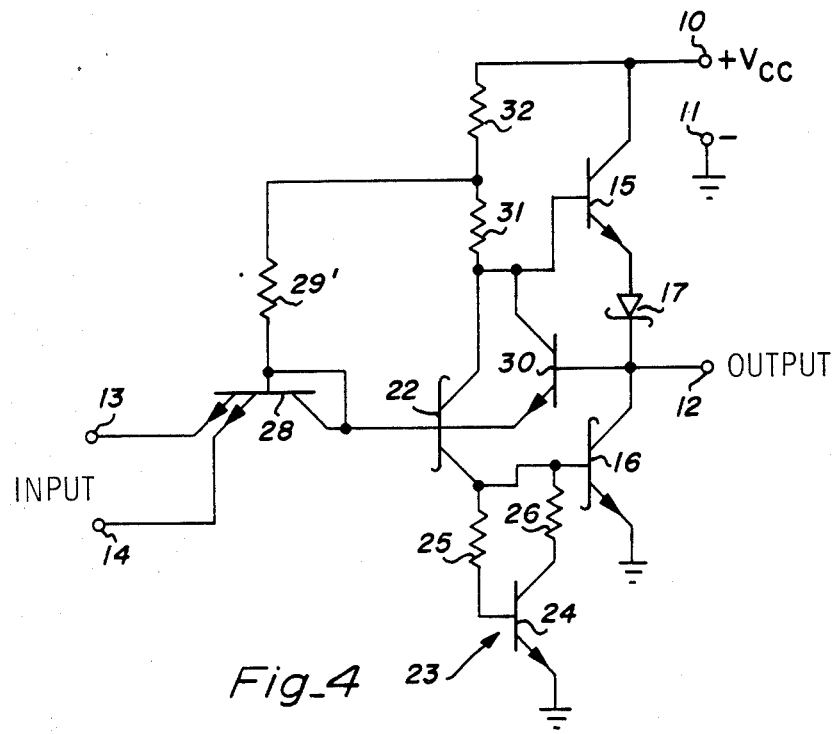
Fig_4

SCHOTTKY TTL INTEGRATED LOGIC GATE CIRCUIT WITH REDUCED SPEED POWER PRODUCT

BACKGROUND OF THE INVENTION

Schottky-clamped Transistor-Transistor Logic (TTL) circuits have progressed to structures that have average signal propagation delays on the order of a nano-second. Speed power product values of a few picojoules are common. It is desirable to improve the speed power product of the internal gates in an IC chip and to reduce the area so that more gates can be integrated into a single chip. For such internal gates it is further desirable to reduce the signal voltage swing. Such reduced signal swing will improve speed and at the same time will reduce noise coupling (commonly called RFI) to nearby circuitry.

In the recently developed Advanced Low-power Schottky (ALS) devices it has been found desirable to keep the gate output signal swing below about 3 volts to avoid diode breakdown in the plural emitter transistor structures in the gate input circuits. Since the typical gate power supply voltage is 5 volts, some form of signal limiting must be employed. Typically this has been accomplished by means of a series string of diodes or a resistor voltage divider. Both of these methods require extra chip area and increase the signal propagation delay.

SUMMARY OF THE INVENTION

It is an object of the invention to reduce the speed power product in an internal TTL gate.

It is a further object of the invention to reduce the signal swing in an internal TTL gate to improve speed, reduce RFI, and prevent breakdown in the input diodes in cascaded gates.

It is a still further object of the invention to reduce the area required to fabricate a TTL internal gate which has a low speed power product.

It is a still further object of the invention to reduce the speed power product in a TTL internal gate that requires less IC chip area to fabricate without sacrificing other performance characteristics.

These and other objects are achieved by employing a conventional TTL circuit and adding a transistor that is connected in a negative feedback configuration around the pull-up output transistor. The added transistor is constructed as a minimum area device located within the isolated portion of IC that contains the output stage driver (phase splitter) transistor. This added transistor takes the place of either an array of diodes or a high value resistor thereby reducing the IC area requirement. An additional area saving and improvement in speed power product is achieved by reducing the value of the input resistor and returning it to a tap on the output driver transistor load resistor. Thus the circuit of the invention reduces the IC chip area and, by its electrical action, reduces the speed power product.

BRIEF DESCRIPTION OF THE DRAWING

FIG. 1 is a schematic diagram of the standard prior art ALS inverter gate.

FIG. 2 is a schematic diagram of the circuit of the invention.

FIG. 3 is a graph showing the waveform of the FIG. 2 circuit operation.

FIG. 4 is a schematic diagram of an alternative circuit of the invention.

DESCRIPTION OF THE PRIOR ART

FIG. 1 represents a schematic diagram of a conventional ALS inverter gate. A $V_{CC}$ power supply (typically 5 volts) is connected between +terminal 10 and −terminal 11 which is shown grounded. Output terminal 12 provides an inverted replica of the logic signal at either input terminal 13 or terminal 14. If either terminal 13 or 14 is low terminal 12 will be high so that the gate shown is a NAND gate. The inputs will normally be high (by returning them to $+V_{CC}$ by means not shown) so that output 12 will normally be low.

While a two-input NAND gate is shown, it is to be understood that additional inputs could be added. In the FIG. 1 circuit additional emitters in transistor 28 would be added. Also, while a plural emitter transistor is shown, each input could be achieved by employing a separate diode.

In the following discussion certain conventional abbreviations will be used. These abbreviations and their meanings are:

$V_{OL}$ = gate output voltage for the low or logic zero state $V_{OH}$ = gate output voltage for the high or logic one state $V_{BE}$ = the base to emitter of a conducting transistor (the same symbol applies to the forward voltage drop across a conducting pn junction diode)

$V_{SH}$ = The forward voltage drop across a conducting Schottky diode.

Output terminal 12 is driven by a combination of a current source transistor 15, and a current sink transistor 16. These devices operate respectively as a pull-up device and a pull-down device in what is called "totem pole" fashion. The output current path is completed by level shifting Schottky diode 17 which is forward biased when source 15 is conductive. Transistor 16 is of Schottky construction to avoid saturation problems and when turned on its collector voltage is about 0.2 volt which is the logic $V_{OL}$ state. When transistor 15 is turned on it can be seen that its base is limited to $2V_{BE}$ plus $2V_{SH}$, or about 2.4 volts at 300° K., above ground by virtue of the diode 18–21 series string. Since terminal 12 is one $V_{BE}$ plus one $V_{SH}$ below the base of transistor 15, the output for $V_{OH}$ is $V_{BE}+V_{SH}$ or about 1.2 volts at 300° K.

Transistor 22, operating as a phase splitter, drives transistor 16 from its emitter and transistor 15 from its collector. A clamp 23 is coupled between the base of transistor 16 and ground. Clamp 23 is composed of transistor 24, base resistor 25 and collector resistor 26. Resistor 27 acts as the collector load for transistor 22.

Dual emitter transistor 28 drives the base of transistor 22. Since the base is shorted to the collector in transistor 28 it acts as a pair of diodes that couple inputs 13 and 14 to the base of transistor 22. Resistor 29 returns the base of transistor 22 to $V_{CC}$ so that in the absence of inputs transistor 22 will be turned on. When transistor 22 is turned on its emitter will force current into the base of transistor 16 thus turning it on so as to pull output terminal 12 low. At the same time conduction in transistor 22 will pull its collector down thereby turning transistor 15 off (along with diodes 18–21).

With either terminal 13 or 14 at $V_{OL}$ (low), the base of transistor 22 will be at one $V_{BE}$ above $V_{OL}$. Since the threshold of turn on for the series $V_{BE}$ combination for transistors 16 and 22 will be about 2 $V_{BE}$, this will hold transistors 16 and 22 off. In terms of input terminal threshold, conduction in transistor 22 will occur whenever either terminal 13 or 14 rises above one $V_{BE}$ which represents the gate threshold. When transistor 22 is turned off part of the current flowing in resistor 27 flows into the base node of transistor 15. The series diode 18-21 string will clamp the base of transistor 15 at 2 $V_{BE}+2$ $V_{SH}$ or about 2.4 volts at 300° K. This will turn transistor 15 on so it will act as a voltage source to terminal 12. For this condition Schottky diode 17 will be forward biased to conduct any sourced current. When transistor 15 is turned on the voltage level ($V_{OH}$) at terminal 12 will be 2 $V_{BE}+2$ $V_{SH}-V_{BE}-V_{SH}$ which reduces to $V_{BE}+V_{SH}$ or about 1.2 volts at 300° K.

In a second embodiment of the prior art circuit the diode string 18-21 can be replaced with a resistor having a value roughly equal to the value of resistor 27. This biases the base of transistor 15 at $V_{CC}/2$ when transistor 22 is off. Thus, while diodes 18-21 provide a bias clamp which is about 2.4 volts at room temperature and this bias falls with increasing temperature, the resistor divider will provide a bias level of about 2.5 volts, which will develop a $V_{OH}$ of about 1.3 volts at room temperature and characteristically rises with increasing temperature. One of the greatest disadvantages of this embodiment is that about ½ of any noise on the $+V_{CC}$ line will be applied to the base of transistor 15 and will thus appear as a signal at the output.

It will be noted that diode string 18-21 includes Schottky series elements (notably diodes 18 and 20) so that diode turn off is no problem. This version of the ALS gate is faster than the alternative using the resistor divider but takes more area. Generally, since the diode version displays a slightly lower speed power product and is less responsive to $V_{CC}$ noise, it is ordinarily the preferred form of circuit.

DESCRIPTION OF THE INVENTION

FIG. 2 is a schematic diagram of the circuit of the invention. Where the elements are the same as those in FIG. 1 the same numbers are employed. Two changes are evident. Transistor 30 replaces diode string 18-21 and resistor 27 is replaced by a pair of resistors 31 and 32. The input bias resistor 29' is returned to the juncture of resistors 31 and 32 rather than $V_{CC}$. Thus the input bias resistor circuit includes negative feedback from transistor 22 which results in the use of a smaller input resistor for the same base drive into transistor 22.

With inputs 13 and 14 floating or high so as to turn transistor 22 on, output terminal 12 will be at $V_{OL}$ or about 0.2 volt at 300° K., due to conduction in transistor 16. Thus, $V_{OL}$ is the same as that for FIG. 1. For this condition the base of transistor 30 will be low and its emitter high so as to keep it nonconductive.

FIG. 3 is a graph showing the operation of the circuit of FIG. 2. In the time period $t_0$ to $t_1$ the input is low. With either input 13 or 14 at $V_{OL}$ (low), the base of transistor 22 and, therefore, the emitter of transistor 30, will be clamped at about $V_{BE}$ plus $V_{OL}$ (about 0.9 volt at 300° K.) above ground. This will hold both transistors 22 and 16 off. Transistor 30 will be on so that most of the current flowing in resistors 31 and 32 will be returned to the input node at the base of transistor 22. Part of the current in resistors 31 and 32 will provide base drive for transistor 15, the emitter of which will act through diode 17 as a voltage source to output terminal 12. The emitter of transistor 15 will be clamped at 2 $V_{BE}+V_{OL}$ by the action of transistors 30 and 28 along with the $V_{OL}$ state of input terminal 13 or 14. $V_{OH}$ will be 2 $V_{BE}+V_{OL}-V_{SH}$ which is close to 1.1 volts at 300° K.

Transistor 30 is made to have the smallest available geometry (on the order of 0.03 mil$^2$) in the bipolar Schottky IC process. Physically, transistor 30 will be fabricated in the same IC tub as transistor 22. This feature automatically provides the collector connection. Transistor 30 occupies only a small fraction of the transistor 22 tub. Transistor 30 improves the speed power product of the gate by diverting the collector load current of transistor 22 (which is wastefully drained to ground by the clamp circuit in the prior art), under input low condition, to its base node, where it helps to charge up the node quickly when the input is switched to the high state.

At $t_1$, where the gate input goes high, transistor 28 turns off and the current through transistor 30 along with the current through resistor 29 will quickly pull the base of transistor 22 to the 2 $V_{BE}$ level. As a result, the base and emitter of transistor 15 will also rise thereby pulling up the voltage at output terminal 12. This upward "kick" will be about 0.5 volt which is the difference between the input bias levels of 2 $V_{BE}$ (which represents the clamping level of the series base to emitter connection of transistors 16 and 22) and $V_{BE}+V_{OL}$. In the interval $t_1$ to $t_2$ the output will first rise because of the input swing and the level shift in transistor 30 and will thereafter fall because of the onset of conduction in transistors 22 and 16 which will pull the output low. At $t_3$ the output will reach $V_{OL}$ and will remain there until the input goes low at $t_4$. At this point the conditions will revert to the $V_{OH}$ state, as described above, where it will stabilize at $t_5$.

Resistors 31 and 32 provide the pull up current that turns transistor 15 on which in turn turns transistor 30 on. Thus, these resistors also serve as pull up means for the input node at the base of transistor 22. In the prior art circuit of FIG. 1 resistor 29 must be relatively large so that it takes up considerable IC chip area. In the FIG. 2 circuit the upward voltage kick in the $t_1-t_2$ interval appears not only at output terminal 12 but also at the emitter and base of transistor 15. Thus, an upward kick also appears at the juncture of resistors 31 and 32. This kick also raises the voltage applied to the upper end of resistor 29' which creates a transient current therein to charge the input node at the base of transistor 22. This provides an additional speed increase. However, in the $V_{OL}$ state when the input node is high and the collector of transistor 22 is low the quiescent voltage across resistor 29' is low so its low value does not result in excessive current drain. Thus, in effect the only time a large voltage appears across resistor 29' is when a transient current is needed to speed up circuit operation. This action results in further reduction of the speed power product and a reduced resistor area requirement.

From the above description it can be seen that the interval $t_1-t_3$ represents the high to low propagation delay while the $t_4-t_5$ interval represents the low to high propagation delay. For the circuit of FIG. 2 these delay values are typically 1.3 and 1.5 nanoseconds respectively. This gives an average propagation delay of about 1.4 nanoseconds. The speed power product is about 3.5 picojoules. In the circuit of FIG. 1 the optimum speed power product is 5.7 picojoules and in its alternative (resistor divider) circuit the optimum speed power product is close to 6 picojoules.

Since transistor 30 requires much less IC chip area to implement than the diode 18–21 string of FIG. 1 (or the alternative resistor) the circuit of the invention provides an area economy.

FIG. 4 is a schematic diagram of an alternative circuit to that of FIG. 2. The difference is that the base of transistor 30 is connected to the collector of transistor 16 rather than the emitter of transistor 15. In this circuit configuration $V_{OH}=2\ V_{BE}+V_{OL}$ or about 1.6 volts at 300° K. rather than the 1.1 volt of FIG. 2. The spike at the $t_1$–$t_2$ interval would rise to a level of about 2.3 volts rather than 1.6 volts. Otherwise the two circuit configurations will operate in a similar manner.

The invention has been described and an alternative embodiment detailed. When the foregoing description is read there are alternatives and equivalents, within the spirit and intent of the invention, that will occur to a person skilled in the art. For example, while bipolar Schottky devices are shown the invention could apply to metal oxide semiconductor (MOS) devices. Accordingly, it is intended that the scope of the invention be limited only by the claims that follow.

I claim:

1. A low power inverter gate circuit having input and output terminals wherein said output terminal provides an inverted logic state representation of the input terminal logic state, said circuit comprising;
   first and second supply rails connectable to a source of operating power;
   current source transistor means coupled between said first supply rail and said output terminal and having a control terminal;
   current sink transistor means coupled between said second supply rail and said output terminal and having a control terminal;
   phase splitter transistor means having a control terminal, a first output coupled to said control terminal of said current source transistor means, and a second output coupled to said control terminal of said current sink transistor means;
   diode means coupled between said input terminal and said control terminal of said phase splitter transistor means; and
   active transistor means having a control terminal coupled to said output terminal and controlled terminals coupled between said control terminal of said phase splitter transistor means and said control terminal of said current source transistor means.

2. The circuit of claim 1 wherein said diode means comprise a plurality of diodes, each one coupling a separate one of a plurality of input terminals to the control terminal of said phase splitter transistor means.

3. The circuit of claim 1 wherein said transistor means comprise metal oxide semiconductor transistors.

4. The circuit of claim 1 wherein said control terminal of said current source transistor means is coupled by way of first and second series connected resistors to said first supply rail and a third resistor is coupled between the juncture of said first and second resistors and said control terminal of said phase splitter transistor means.

5. The circuit of claim 1 wherein said transistor means comprise bipolar transistors.

6. The circuit of claim 5 wherein said current sink transistor means and said phase splitter transistor means comprise Schottky diode clamped bipolar transistors.

7. The circuit of claim 6 wherein said current source bipolar transistor means include a Schottky diode coupled in series therewith to said output terminal.

8. In a logic circuit employing transistor devices that have controlled terminals and a control terminal said circuit comprising a transmission inverter gate having a totem pole output stage that includes a pull up device and a pull down device driven by a phase splitter device the improvement comprising:
   a feedback transistor device having its control terminal coupled to the output of said gate and its controlled terminals coupled between the control terminal of said phase splitter device and the control terminal of said pull up device.

9. The improvement of claim 8 wherein said transistor devices are of metal oxide semiconductor construction.

10. The improvement of claim 8 wherein said transistors are of bipolar device construction.

11. The improvement of claim 10 wherein said pull down and said phase splitter devices are of bipolar Schottky construction.

12. A logic inverter gate circuit having input and output terminals, said circuit comprising:
   first and second supply terminals connectable to a source of operating power;
   a first transistor having a collector coupled to said first supply terminal, an emitter coupled to said output terminal and a base;
   a second transistor having an emitter coupled to said second supply terminal a collector coupled to said output terminal, and a base;
   a third transistor having an emitter coupled to said base of said second transistor, a collector coupled to said base of said first transistor, and a base
   a first diode coupled between said input terminal and said base of said third transistor; and
   a fourth transistor having an emitter coupled to said base of said third transistor, a base coupled to said output terminal and a collector coupled to said collector of said third transistor.

13. The circuit of claim 12 further comprising current conducting means coupled between said base of said second transistor and said second supply terminal and, first resistor means coupled between said collector of said third transistor and said first supply terminal.

14. The circuit of claim 13 further including second diode means coupled in series with said emitter of said first transistor and poled to conduct therewith.

15. The circuit of claim 14 wherein said first resistor means includes a tap that is connected to one end of a second resistor means the other end of which is connected to said base of said third transistor whereby the value of said second resistor can be reduced to a low value without introducing excessive loading.

16. The circuit of claim 14 wherein said second diode, and said second and third transistors are of Schottky construction.

* * * * *